(12) United States Patent
Ji

(10) Patent No.: US 12,107,059 B2
(45) Date of Patent: Oct. 1, 2024

(54) SEMICONDUCTOR PACKAGE AND MANUFACTURING METHOD THEREOF

(71) Applicant: MEDIATEK Inc., Hsin-Chu (TW)

(72) Inventor: Yan-Liang Ji, Hsinchu (TW)

(73) Assignee: MEDIATEK Inc., Hsin-Chu (TW)

( * ) Notice: Subject to any disclaimer, the term of this patent is extended or adjusted under 35 U.S.C. 154(b) by 218 days.

(21) Appl. No.: 17/687,723

(22) Filed: Mar. 7, 2022

(65) Prior Publication Data

US 2022/0328435 A1 Oct. 13, 2022

Related U.S. Application Data

(60) Provisional application No. 63/172,125, filed on Apr. 8, 2021.

(51) Int. Cl.
*H01L 23/00* (2006.01)

(52) U.S. Cl.
CPC .............. *H01L 24/05* (2013.01); *H01L 24/03* (2013.01); *H01L 2224/02206* (2013.01);
(Continued)

(58) Field of Classification Search
CPC ...................... H01L 24/05; H01L 24/03; H01L 2224/02206; H01L 2224/03013; H01L 2224/03466; H01L 2224/0401; H01L 2224/05558; H01L 2224/05582; H01L 2224/05624; H01L 2224/05647; H01L 2924/0132; H01L 2224/0239; H01L 2224/0345; H01L 2224/0346; H01L 2224/0391; H01L 2224/05022; H01L 2224/05027; H01L 2224/05099; H01L 2224/05548; H01L 2224/05567; H01L 2224/05572; H01L 2224/06051; H01L 2224/06102; H01L 2224/13017; H01L 2224/13022; H01L 2224/131; H01L 2224/1403; H01L 2224/1411; H01L 23/3171; H01L 23/3192; H01L 24/13;
(Continued)

(56) References Cited

U.S. PATENT DOCUMENTS

2013/0140706 A1 6/2013 Yu
2015/0364436 A1 12/2015 Yu
(Continued)

FOREIGN PATENT DOCUMENTS

GB 2464549 A 4/2010
KR 20100048622 A 5/2010

OTHER PUBLICATIONS

EP Search Reported dated Sep. 12, 2022 in European application No. 22162830.8-1211.

*Primary Examiner* — Karen Kusumakar
*Assistant Examiner* — Shawn Shaw Muslim
(74) *Attorney, Agent, or Firm* — McClure, Qualey & Rodack, LLP

(57) ABSTRACT

A semiconductor package includes a substrate, a first insulation layer, a conductive via and a conductive trace. The substrate includes a conductive component. The first insulation layer is formed on the substrate and having a first through hole exposing the conductive component. The conductive via is formed within the first through hole. The conductive trace is directly connected to the conductive via which is located directly above the first through hole.

18 Claims, 5 Drawing Sheets

(52) U.S. Cl.
CPC .............. *H01L 2224/03013* (2013.01); *H01L 2224/03466* (2013.01); *H01L 2224/0401* (2013.01); *H01L 2224/05558* (2013.01); *H01L 2224/05582* (2013.01); *H01L 2224/05624* (2013.01); *H01L 2224/05647* (2013.01); *H01L 2924/0132* (2013.01)

(58) Field of Classification Search
CPC ....... H01L 23/481; H01L 21/56; H01L 21/60; H01L 24/11; H01L 2021/60225; H01L 2224/111; H01L 2224/13009
USPC ......... 257/773–775, 738; 438/618, 622, 652, 438/666, 669, 672, 675
See application file for complete search history.

(56) References Cited

U.S. PATENT DOCUMENTS

| | | | |
|---|---|---|---|
| 2016/0005702 A1 | 1/2016 | Shih | |
| 2017/0263523 A1* | 9/2017 | Ji | ............................. H01L 24/08 |
| 2017/0345726 A1* | 11/2017 | Huang | ................ H01L 21/4846 |
| 2021/0242119 A1* | 8/2021 | Ho | ..................... H01L 21/6835 |

\* cited by examiner

SEMICONDUCTOR PACKAGE AND MANUFACTURING METHOD THEREOF

This application claims the benefit of U.S. Provisional application Ser. No. 63/172,125, filed Apr. 8, 2021, the disclosure of which is incorporated by reference herein in its entirety.

FIELD OF THE INVENTION

The invention relates to a semiconductor package and a manufacturing method thereof, and more particularly to a semiconductor package and a manufacturing method thereof including a conductive via.

BACKGROUND OF THE INVENTION

Conventional semiconductor package includes a conductive via, conductive trace and a substrate including a conductive component, wherein the conductive via electrically connects the conductive trace and the conductive component. However, a conductive path between the conductive via and the conductive trace results in parasitic resistance. Thus, how to reduce the parasitic resistance has become a prominent task for the industries.

SUMMARY OF THE INVENTION

In an embodiment of the invention, a semiconductor package is provided. The semiconductor package includes a substrate, a first insulation layer, a conductive via and a conductive trace. The substrate includes a conductive component. The first insulation layer is formed on the substrate and having a first through hole exposing the conductive component. The conductive via is formed within the first through hole. The conductive trace is directly connected to the conductive via which is located directly above the first through hole.

In another embodiment of the invention, a semiconductor package is provided. The manufacturing method includes the following steps: providing a substrate includes a conductive component; forming a first insulation layer on the substrate, wherein the first insulation layer has a first through hole exposing the conductive component; forming a conductive via within the first through hole; and forming a conductive trace directly connected to the conductive via which is located directly above the first through hole.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
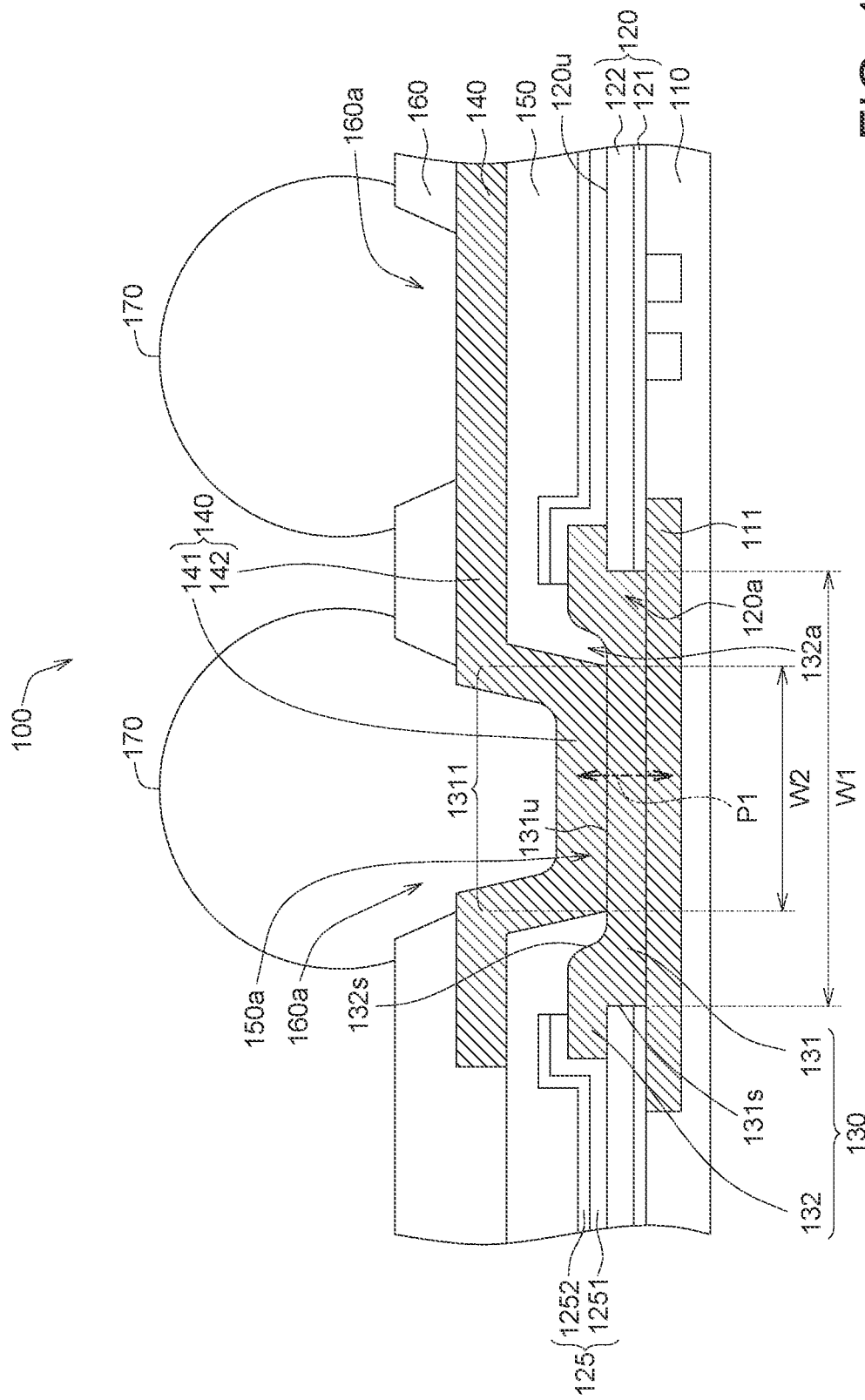
FIG. 1 illustrates a diagram view of a semiconductor package according to an embodiment of the invention.

Referring to FIG. 1, FIG. 1 illustrates a diagram view of a semiconductor package 100 according to an embodiment of the invention. The semiconductor package 100 includes a substrate 110, a first insulation layer 120, a second insulation layer 125, at least one conductive via 131, a protrusion layer 132, at least one conductive trace 140, a first encapsulation 150, a second encapsulation 160 and at least one conductive portion 170. The semiconductor package 100 is, for example, Wafer Level Chip Scale Packaging (WLCSP).

The substrate 110 includes at least one conductive component 111. The first insulation layer 120 is formed on the substrate 110 and has at least one first through hole 120a exposing the conductive component 111. The conductive via 131 is formed within the first through hole 120a. The conductive trace 140 is directly connected to the conductive via 131 which is located directly above the first through hole 120a. As a result, a conductive path P1 between the conductive trace 140 and the conductive via 130 is shorter or the shortest (vertical distance), and thus it could reduce/lower parasitic resistance.

As shown in FIG. 1, the substrate 110 is, for example, wafer. The conductive component 111 of the substrate 110 could include, for example, at least one metal layer, at least one conductive trace, at least one conductive via and/or at least one transistor electrically connected to the metal layer, the conductive trace and/or the conductive via.

As shown in FIG. 1, the first insulation layer 120 includes a first layer 121 and a second layer 122. The first layer 121 is formed on the substrate 110, and the second layer 122 is formed on the first layer 121. The first through hole 120a passes through the first layer 121 and the second layer 122. In addition, the first layer 121 is made of a material including, for example, silicon nitride (SiN), and the second layer 122 is made of a material including, for example, oxide.

As shown in FIG. 1, the second insulation layer 125 cover the first insulation layer 120 and a portion of the protrusion layer 132. The second insulation layer 125 includes a third layer 1251 and a fourth layer 1252. The third layer 1251 cover the first insulation layer 120 and a portion of the protrusion layer 132, and the fourth layer 1252 is formed on the third layer 1251. The third layer 1251 is made of a material including, for example, oxide, and the fourth layer 1252 is made of a material including, for example, silicon nitride (SiN). In addition, the second insulation layer 125 has at least one opening 125a exposing a portion of the conductive via 131 and/or a portion of the protrusion layer 132.

As shown in FIG. 1, the conductive via 131 is directly formed on the conductive component 111 of the substrate 110 through the first through hole 120a. In other words, there is no physical material between the conductive component 111 and the conductive via 131. At least one portion of the conductive via 131 could be formed within the first through hole 120a. The conductive via 131 has an upper surface 131u which could protrude relative to an upper surface 120u of the first insulation layer 120. In another embodiment, the upper surface 131u could be recessed relative to an upper surface 120u of the first insulation layer 120, or is flush with the upper surface 120u of the first insulation layer 120.

As shown in FIG. 1, the conductive via 131 has a width W1 ranging between 20 micrometer (μm) and 800 μm, even less or more. The width W1 is larger than a width W2 of the conductive trace 140, and accordingly it could prevent the conductive via 131 from forming/generating recess, cavity, concave and/or crack. Thus, the conductive via 131 of the present embodiment has a sufficient strength. In addition, viewing from a top direction, the conductive via 131 could be circle, polygon, ellipse, etc.

As shown in FIG. 1, the protrusion layer 132 connects with the conductive via 131, protrudes relative to the upper surface 131u of the conductive via 131 and extends beyond a lateral surface 131s of the conductive via 131. The protrusion layer 132 and the conductive via 131 form a conductive pad 130, and the semiconductor package 100 includes at least one conductive pad 130.

In an embodiment, the conductive via 131 and the protrusion layer 132 could be formed in the same manufacture process, for example, sputtering. As a result, the conductive via 131 and the protrusion layer 132 could form an integral structure. In addition, due to sputtering, the protrusion layer 132 forms a curved lateral surface 132s connected to the upper surface 131u of the conductive via 131. In addition, the protrusion layer 132 has an opening 132a exposing the conductive via 131, wherein the conductive trace 140 is connected to the conductive via 131 through the opening 132a. In terms of material, the conductive via 131 and the protrusion layer 132 could be made of a material including, for example, aluminum, copper or combination thereof. In addition, viewing from a top direction, the protrusion layer 132 could be a closed-ring or opened-ring exposing the upper surface 131u of the conductive via 131.

As shown in FIG. 1, at least one conductive trace 140 is, for example, at least one of a portion of Redistribution Layer (RDL). The conductive trace 140 includes a connecting portion 141 and an extending portion 142 connected to the connecting portion 141, wherein the connecting portion 141 is directly connected to the conductive via 131, for example, the exposed portion 1311, and the extending portion 142 extends on the first encapsulation 150. The connecting portion 141 has the aforementioned width W2. The conductive trace 140 and the conductive via 131 overlap up and down. For example, the connecting portion 141 of the conductive trace 140 and the conductive via 131 overlap up and down. Furthermore, the first through hole 120a, the connecting portion 141 and the conductive via 131 overlap up and down. In terms of material, the conductive trace 140 could be made of a material including, for example, aluminum, copper or combination thereof.

As shown in FIG. 1, the first encapsulation 150 covers the first insulation layer 120, the second insulation layer 125, a portion of the conductive via 131 and/or a portion of the protrusion layer 132. The first encapsulation 150 has at least one second through hole 150a exposing an exposed portion 1311 of the conductive via 131. The conductive trace 140 directly connected to the exposed portion 1311 through the second through hole 150a. In an embodiment, the first encapsulation 150 could be made of a material including, for example, PBO (Polybenzoxazole) or molding compound material.

The second encapsulation 160 covers the conductive trace 140 and the first encapsulation 150. The second encapsulation 160 has at least one an opening 160a exposing a portion of the connecting portion 141 and/or at least one portion of the extending portion 142 of the conductive trace 140. In addition, the second encapsulation 160 could be made of a material, for example, similar to or the same as that of the first encapsulation 150. Each conductive portion 170 is physically connected or electrically connected to the conductive trace 140 through the corresponding opening 160a. In an embodiment, the conductive portion 170 is, for example, solder ball, conductive pillar, etc.

FIGS. 2A to 2F illustrate manufacturing processes of the semiconductor package 100 of FIG. 1.

Figure 2A:
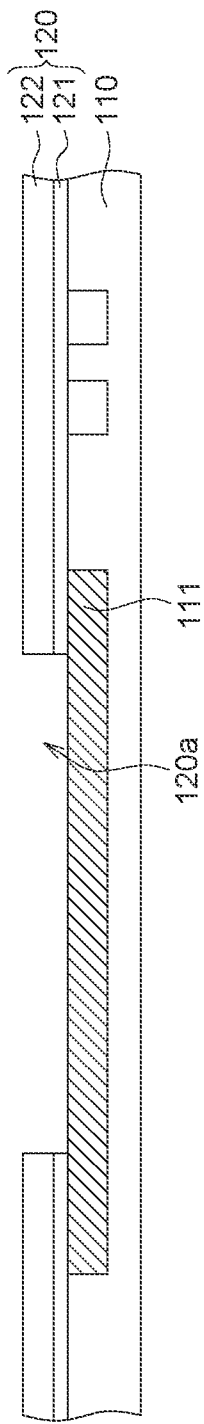
FIGS. 2A to 2F illustrate manufacturing processes of the semiconductor package of FIG. 1.

As illustrated in FIG. 2A, the substrate 110 is provided, wherein the substrate 110 is, for example, wafer, and the substrate 110 includes at least one conductive component 111, at least one metal layer (not illustrated), at least one conductive trace (not illustrated), at least one conductive via (not illustrated) and/or at least one transistor (not illustrated) electrically connected to the metal layer, the conductive trace and/or the conductive via.

As illustrated in FIG. 2A, the first insulation layer 120 including the first layer 121 and the second layer 122 is formed on substrate 110. The first insulation layer 120 has at least one first through hole 120a exposing the corresponding conductive component 111. The first through hole 120a is formed by using, for example, etching.

Figure 2B:
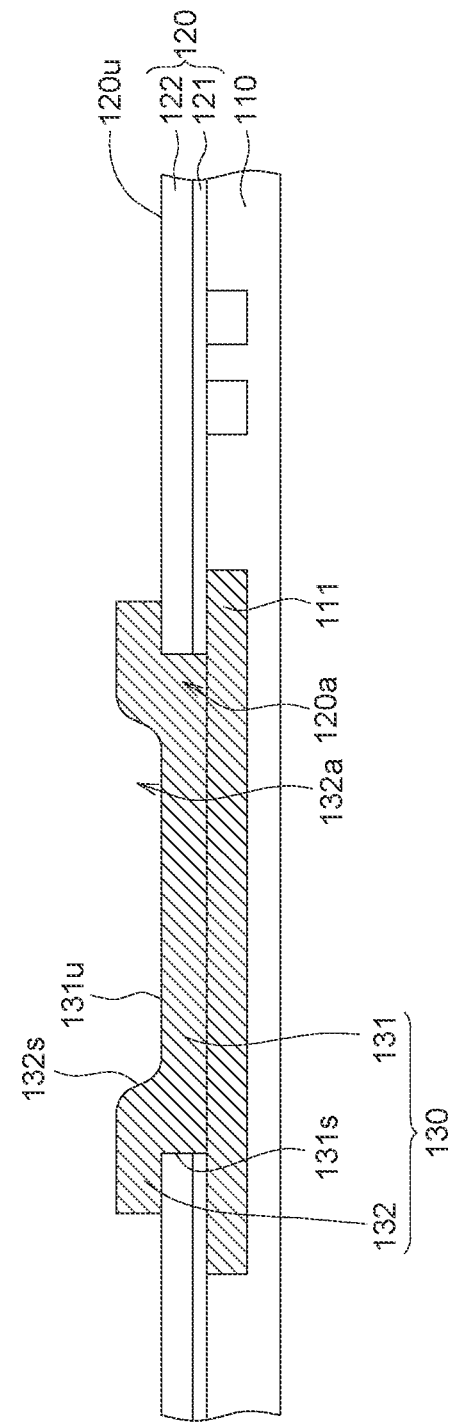

As illustrated in FIG. 2B, at least one conductive via 131 and at least one protrusion layer 132 are formed within the corresponding first through hole 120a. The at least one protrusion layer 132 and the at least one conductive via 131 form at least one conductive pad 130. In the present embodiment, the conductive via 131 and the protrusion layer 132 could be formed in the same manufacture process, for example, sputtering, and thus the conductive via 131 and the protrusion layer 132 could form an integral structure. Due to sputtering, the protrusion layer 132 forms the curved lateral surface 132s connected to the upper surface 131u of the conductive via 131. In addition, the protrusion layer 132 has the opening 132a exposing the conductive via 131, and the conductive trace 140 is connected to the conductive via 131 through the opening 132a. In terms of material, the conductive via 131 and the protrusion layer 132 could be made of a material including, for example, aluminum, copper or combination thereof. In addition, viewing from a top direction, the protrusion layer 132 could be a closed-ring or opened-ring exposing the upper surface 131u of the conductive via 131. The protrusion layer 132 connects with the conductive via 131, protrudes relative to the upper surface 131u of the conductive via 131 and extends beyond a lateral surface 131s of the conductive via 131.

Figure 2C:
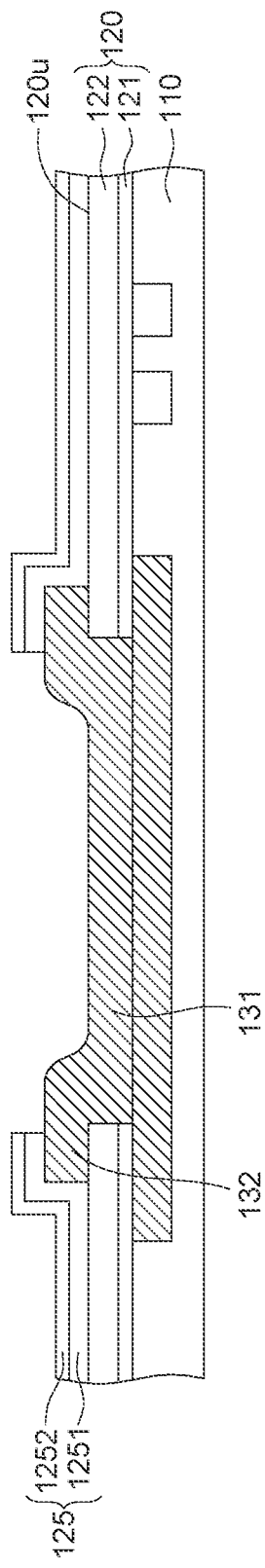

As illustrated in FIG. 2C, the second insulation layer 125 including the third layer 1251 and the fourth layer 1252 is formed on a portion of the first insulation layer 120 and a portion of the protrusion layer 132. The second insulation layer 125 has at least one opening 125a exposing a portion of the conductive via 131 and a portion of the protrusion layer 132. The opening 125a is formed by using, for example, etching.

Figure 2D:
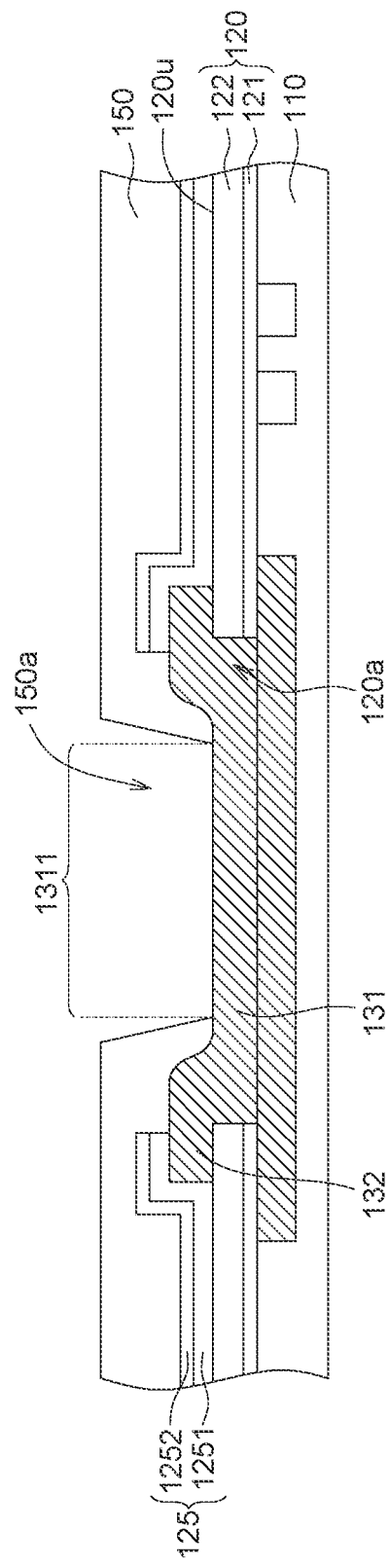

As illustrated in FIG. 2D, the encapsulation 150 is formed on the second insulation layer 125 and the first insulation layer 120 by using, for example, coating, applying, etc, wherein the encapsulation 150 has at least one second through hole 150a exposing an exposed portion of the conductive via 131, for example, the exposed portion 1311. The second through hole 150a is formed by using, for example, etching, etc.

Figure 2E:
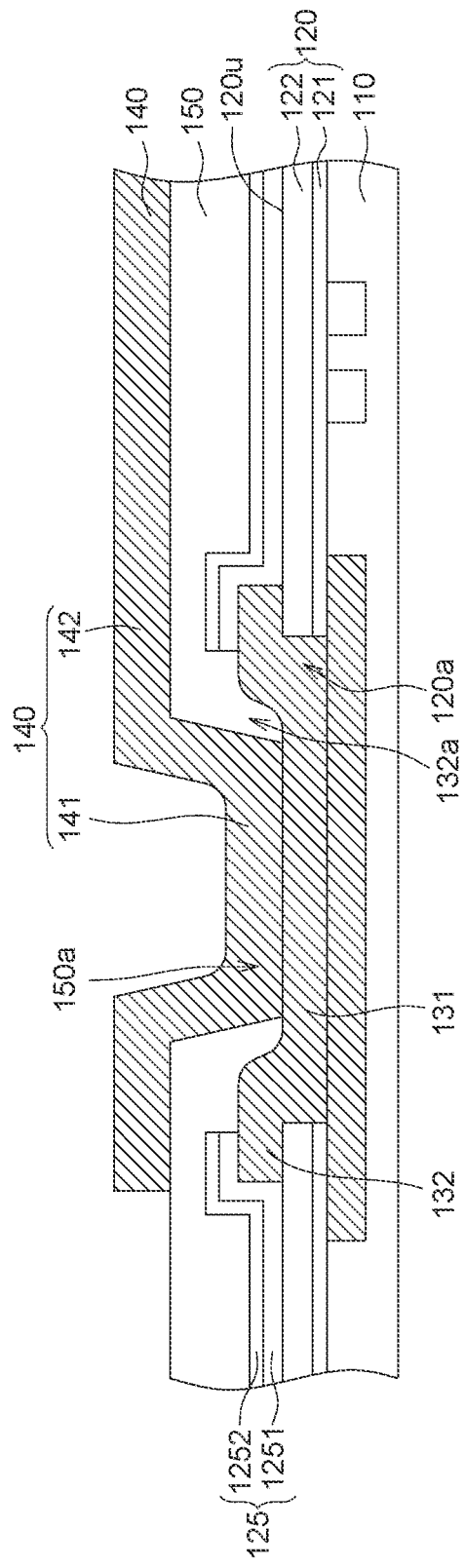

As illustrated in FIG. 2E, at least one conductive trace 140 is formed on the encapsulation 150 by using, for example, sputtering, plating, etc. The conductive trace 140 includes the connecting portion 141 and the extending portion 142 connected to the connecting portion 141, wherein the connecting portion 141 is directly connected to the conductive via 131 through the second through hole 150a. The conductive trace 140 and the conductive via 131 overlap up and down. For example, the connecting portion 141 of the conductive trace 140 and the conductive via 131 overlap up and down. Furthermore, the first through hole 120a, the connecting portion 141 and the conductive via 131 overlap up and down. In terms of material, the conductive trace 140 could be made of a material including, for example, aluminum, copper or combination thereof.

Figure 2F:
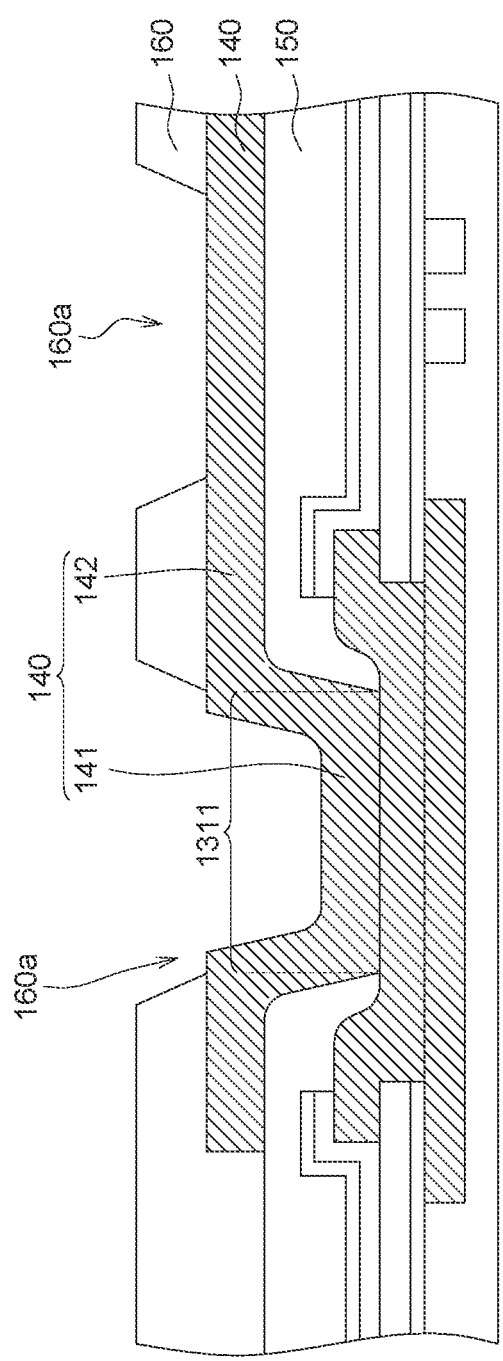

As illustrated in FIG. 2F, the second encapsulation 160 covering the conductive trace 140 is formed by using, for example, coating, applying, etc. The second encapsulation 160 has at least one an opening 160a exposing a portion of the connecting portion 141 and/or at least one portion of the extending portion 142 of the conductive trace 140. In addition, the second encapsulation 160 could be made of a material, for example, similar to or the same as that of the first encapsulation 150.

Then, at least one conductive portion 170 physically connected or electrically connected to the conductive trace 140 is formed through the corresponding opening 160a, as shown in FIG. 1. In an embodiment, the conductive portion 170 is, for example, solder ball, conductive pillar, etc.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprising:
    a substrate comprising a conductive component;
    a first insulation layer formed on the substrate and having a first through hole exposing the conductive component;
    a conductive via formed within the first through hole; and
    a conductive trace directly connected to the conductive via which is located directly above the first through hole;
    wherein the conductive trace has a recess overlapping the conductive via in a thickness direction of the semiconductor package.

2. The semiconductor package as claimed in claim 1, further comprising:
    an encapsulation covering the first insulation layer and having a second through hole which exposes an exposed portion of the conductive via;
    wherein the conductive trace is directly connected to the conductive via through the first through hole and the second through hole.

3. The semiconductor package as claimed in claim 1, wherein the conductive via is directly formed on the conductive component of the substrate through the first through hole.

4. The semiconductor package as claimed in claim 1, wherein there is no physical material between the conductive via and the conductive component.

5. The semiconductor package as claimed in claim 1, further comprises:
    a protrusion layer connecting with the conductive via, protruding relative to an upper surface of the conductive via and extending beyond a lateral surface of the conductive via.

6. The semiconductor package as claimed in claim 5, wherein the protrusion layer has an opening exposing the conductive via, and the conductive trace is connected to the conductive via through the opening.

7. The semiconductor package as claimed in claim 1, wherein the conductive via and the conductive trace overlap in the thickness direction of the semiconductor package.

8. The semiconductor package as claimed in claim 7, wherein the conductive trace comprises a connecting portion and an extending portion connected to the connecting portion, the connecting portion is directly connected to the conductive via, and the connecting portion and the conductive via overlap up and down.

9. The semiconductor package as claimed in claim 5, wherein the protrusion layer has a curved lateral surface connected to an upper surface of the conductive via.

10. A manufacturing method, comprising:
    providing a substrate comprising a conductive component;
    forming a first insulation layer on the substrate, wherein the first insulation layer has a first through hole exposing the conductive component;
    forming a conductive via within the first through hole; and
    forming a conductive trace directly connected to the conductive via which is located directly above the first through hole, wherein the conductive trace has a recess overlapping the conductive via in a thickness direction of the semiconductor package.

11. The manufacturing method as claimed in claim 10, further comprising:
    forming an encapsulation on the first insulation layer, wherein the encapsulation has a second through hole exposing an exposed portion of the conductive via;
    wherein in step of forming the conductive trace directly connected to the conductive via which is located directly above the first through hole, the conductive trace is directly connected to the conductive via through the second through hole.

12. The manufacturing method as claimed in claim 10, wherein in step of forming the conductive via within the first through hole, the conductive via is directly formed on the conductive component of the substrate through the first through hole.

13. The manufacturing method as claimed in claim 10, wherein in step of forming the conductive via within the first through hole, there is no physical material between the conductive via and the conductive component.

14. The manufacturing method as claimed in claim 10, further comprises:
    forming a protrusion layer connecting with the conductive via, protruding relative to an upper surface of the conductive via and extending beyond a lateral surface of the conductive via.

15. The manufacturing method as claimed in claim 14, wherein in step of forming the protrusion layer connecting with the conductive via, protruding relative to the upper surface of the conductive via and extending beyond the lateral surface of the conductive via, the protrusion layer has an opening exposing the conductive via, and the conductive trace is connected to the conductive via through the opening.

16. The manufacturing method as claimed in claim 10, wherein in step of forming the conductive trace directly connected to the conductive via which is located directly above the first through hole, the conductive via and the conductive trace overlap up and down.

17. The manufacturing method as claimed in claim 16, wherein in step of forming the conductive trace directly connected to the conductive via which is located directly above the first through hole, the conductive trace comprises a connecting portion and an extending portion connected to the connecting portion, the connecting portion is directly connected to the conductive via, and the connecting portion and the conductive via overlap up and down.

18. The manufacturing method as claimed in claim 14, wherein in step of forming the protrusion layer connecting with the conductive via, protruding relative to an upper surface of the conductive via and extending beyond a lateral surface of the conductive via, the protrusion layer has a curved lateral surface connected to an upper surface of the conductive via.

* * * * *